United States Patent
Park (10) Patent No.: US 6,847,550 B2
(45) Date of Patent: Jan. 25, 2005

(54) NONVOLATILE SEMICONDUCTOR MEMORY HAVING THREE-LEVEL MEMORY CELLS AND PROGRAM AND READ MAPPING CIRCUITS THEREFOR

(75) Inventor: Eungjoon Park, Fremont, CA (US)

(73) Assignee: NexFlash Technologies, Inc., San Jose, CA (US)

(*) Notice: Subject to any disclaimer, the term of this patent is extended or adjusted under 35 U.S.C. 154(b) by 133 days.

(21) Appl. No.: 10/280,939

(22) Filed: Oct. 25, 2002

(65) Prior Publication Data

US 2004/0080979 A1 Apr. 29, 2004

(51) Int. Cl.$^7$ .............................................. G11C 16/04
(52) U.S. Cl. ........................... 365/185.03; 365/185.2; 365/185.24; 365/185.33; 365/185.22
(58) Field of Search ........................ 365/185.03, 185.2, 365/185.24, 185.33, 185.22

(56) References Cited

U.S. PATENT DOCUMENTS

| | | | |
|---|---|---|---|
| 4,415,992 A | 11/1983 | Adlhock | |
| 5,163,021 A | 11/1992 | Mehrotra et al. | |
| 5,357,465 A | 10/1994 | Challa | |
| 5,485,422 A | 1/1996 | Bauer et al. | |
| 5,517,138 A | 5/1996 | Baltar et al. | |
| 5,748,546 A | 5/1998 | Bauer et al. | |
| 5,754,469 A | 5/1998 | Hung et al. | |
| 5,828,616 A | 10/1998 | Bauer et al. | |
| 5,982,667 A | 11/1999 | Jyouno et al. | |
| 6,028,792 A | 2/2000 | Tanaka et al. | |
| 6,052,303 A | 4/2000 | Chevallier et al. | |
| 6,091,631 A | 7/2000 | Kucera et al. | |
| 6,181,603 B1 | 1/2001 | Jyouno et al. | |
| 6,215,697 B1 * | 4/2001 | Lu et al. ................ | 365/185.03 |
| 6,219,276 B1 | 4/2001 | Parker et al. | |
| 6,233,175 B1 * | 5/2001 | Wang et al. ........... | 365/185.03 |
| 6,259,626 B1 | 7/2001 | Pasotti et al. | |
| 6,288,936 B1 * | 9/2001 | Kawamura ............. | 365/185.03 |
| 6,320,785 B1 * | 11/2001 | Yoshida et al. ........ | 365/185.03 |
| 6,366,496 B1 | 4/2002 | Torelli et al. | |
| 6,456,527 B1 | 9/2002 | Campardo et al. | |

OTHER PUBLICATIONS

Wikipedia, Function, http://www.wikipedia.org/w/wiki..phtml, printed Oct. 22, 2002.

* cited by examiner

Primary Examiner—Richard Elms
Assistant Examiner—N Nguyen
(74) Attorney, Agent, or Firm—Altera Law Group, LLC (57) ABSTRACT

A memory uses multiple threshold levels in a memory cell that are not a power of two, and further uses a cell mapping technique wherein the read mapping is only a partial function The domain of read states for a single three-level memory cell, for example, has three states, but only two of them can be uniquely mapped to a bit. The domain of read states for two three-level memory cell, for example, has nine states, but only eight of them can be uniquely mapped to three bits. Although the read mapping is only partial, the voltage margin for the three-level memory cells is larger that the voltage margin available in the commonly used four-level memory cells. This increased voltage margin facilitates memory cell threshold voltage sensing, thereby increasing the reliability of the memory. Memory reliability may be further improved by increasing the voltage margin between the memory cell 0 state and the 1 state relative to the voltage margin between the 1 state and the 2 state, which more effectively accommodates charge loss from the 0 state through electron leakage. Asymmetrical read and program mapping may also be used to improve read reliability in the presence of ground noise or $V_{CC}$ noise.

37 Claims, 8 Drawing Sheets

| 1 TO 1 MAPPING | | |
|---|---|---|
| DEC VALUE | 2 LEVEL CELL | 3 LEVEL CELL |
| 0 | 0 | 0 |
| 1 | 1 | 1 |
| 2 | N/A | 2 |

FIG. 8

| 2 TO 2 MAPPING | | | | |
|---|---|---|---|---|
| DEC VALUE | 2 LEVEL CELL | | 3 LEVEL CELL | |
| 0 | 0 | 0 | 0 | 0 |
| 1 | 0 | 1 | 0 | 1 |
| 2 | 1 | 0 | 0 | 2 |
| 3 | 1 | 1 | 1 | 0 |
| 4-8 | N/A | | OTHER STATES | |

FIG. 9

| 1 TO 2 MAPPING | | |
|---|---|---|
| DEC VALUE | 2 LEVEL CELL | 3 LEVEL CELL |
| 0 | 0 | 0 |
| 1 | 0 | 1 |
| 2 | 1 | 0 | 2 |
| 3 | 1 | 1 | NONE |

Note correction for FIG. 9:

| 1 TO 2 MAPPING | | |
|---|---|---|
| DEC VALUE | 2 LEVEL CELL | 3 LEVEL CELL |
| 0 | 0 | 0 |
| 1 | 0 | 1 |
| 2 | 1 | 0 |
| 3 | 1 | 1 |

FIG. 9

| DEC VALUE | 2 LEVEL CELL | 3 LEVEL CELL |
|---|---|---|
| 0 | 0 | 0 |
| 1 | 1 | 1 |
| 2 | 0 | 2 |
| 3 | 1 | NONE |

FIG. 10

| 2 TO 3 MAPPING | | | | | |
|---|---|---|---|---|---|
| DEC VALUE | 2 LEVEL CELLS | | | 3 LEVEL CELLS | |
| 0 | 0 | 0 | 0 | 0 | 0 |
| 1 | 0 | 0 | 1 | 0 | 1 |
| 2 | 0 | 1 | 0 | 0 | 2 |
| 3 | 0 | 1 | 1 | 1 | 0 |
| 4 | 1 | 0 | 0 | 1 | 1 |
| 5 | 1 | 0 | 1 | 1 | 2 |
| 6 | 1 | 1 | 0 | 2 | 0 |
| 7 | 1 | 1 | 1 | 2 | 1 |
| 8 | N/A | | | 2 | 2 |

FIG. 11

| 3 TO 4 MAPPING | | | | | | | |
|---|---|---|---|---|---|---|---|
| DEC VALUE | 2 LEVEL CELLS | | | | 3 LEVEL CELLS | | |
| 0 | 0 | 0 | 0 | 0 | 0 | 0 | 0 |
| 1 | 0 | 0 | 0 | 1 | 0 | 0 | 1 |
| 2 | 0 | 0 | 1 | 0 | 0 | 0 | 2 |
| 3 | 0 | 0 | 1 | 1 | 0 | 1 | 0 |
| 4 | 0 | 1 | 0 | 0 | 0 | 1 | 1 |
| 5 | 0 | 1 | 0 | 1 | 0 | 1 | 2 |
| 6 | 0 | 1 | 1 | 0 | 0 | 2 | 0 |
| 7 | 0 | 1 | 1 | 1 | 0 | 2 | 1 |
| 8 | 1 | 0 | 0 | 0 | 0 | 2 | 2 |
| 9 | 1 | 0 | 0 | 1 | 1 | 0 | 0 |
| 10 | 1 | 0 | 1 | 0 | 1 | 0 | 1 |
| 11 | 1 | 0 | 1 | 1 | 1 | 0 | 2 |
| 12 | 1 | 1 | 0 | 0 | 1 | 1 | 0 |
| 13 | 1 | 1 | 0 | 1 | 1 | 1 | 1 |
| 14 | 1 | 1 | 1 | 0 | 1 | 1 | 2 |
| 15 | 1 | 1 | 1 | 1 | 1 | 2 | 0 |
| 16 | N/A | | | | 1 | 2 | 1 |
| 17 | N/A | | | | 1 | 2 | 2 |

| BIT GROUPING | 2 LEVELS / CELL | | 4 LEVELS / CELL | | 3 LEVELS / CELL | |
|---|---|---|---|---|---|---|
| | CELLS REQ | % OF CONV | CELLS REQ | % OF CONV | CELLS REQ | % OF CONV |
| 2 BITS | 2 | 100% | 1 | 50% | 2 | 100% |
| 3 BITS | 3 | 100% | 2 | 66.7% | 2 | 66.7% |
| NIBBLE | 4 | 100% | 2 | 50% | 3 | 75% |
| BYTE | 8 | 100% | 4 | 50% | 6 | 75% |
| WORD | 16 | 100% | 8 | 50% | 11 | 68.75% |
| DBL WORD | 32 | 100% | 16 | 50% | 22 | 68.75% |
| QUAD WORD | 64 | 100% | 32 | 50% | 43 | 67.2% |
| 16 BYTES | 128 | 100% | 64 | 50% | 86 | 67.2% |
| 32 BYTES | 256 | 100% | 128 | 50% | 171 | 66.8% |

| 1 TO 1 MAPPING | | | |
|---|---|---|---|
| DEC VALUE | 2 LEVEL CELL | 3 LEVEL CELL | |
| | | READ | PROG |
| 0 | 0 | 0 | 0 |
| 1 | 1 | 1 | N/A |
| | | 2 | 2 |

FIG. 16

| 2 TO 3 MAPPING | | | |
|---|---|---|---|
| DEC VALUE | 2 LEVEL CELLS | 3 LEVEL CELLS | |
| | | READ | PROG |
| 0 | 000 | 00 | 00 |
| 1 | 001 | 01 | N/A |
| 2 | 001 | 02 | 02 |
| 3 | 010 | 10 | 10 |
| 4 | 011 | 11 | 11 |
| 5 | 100 | 12 | 12 |
| 6 | 101 | 20 | 20 |
| 7 | 110 | 21 | 21 |
| 8 | 111 | 22 | 22 |

NONVOLATILE SEMICONDUCTOR MEMORY HAVING THREE-LEVEL MEMORY CELLS AND PROGRAM AND READ MAPPING CIRCUITS THEREFOR

BACKGROUND OF THE INVENTION

1. Field of the Invention

The present invention relates to nonvolatile semiconductor memory, and more particularly to nonvolatile semiconductor memory having three-level memory cells and program and read mapping circuits therefor.

2. Description of the Related Art

Nonvolatile semiconductor memory array retains stored data when power is removed. Many different types of data cells suitable for nonvolatile memory are known, including a class of single transistor devices that are based on the storage of charge in discrete trapping centers of a dielectric layer of the structure, and another class of devices that are based on the storage of charge on a conducting or semiconducting layer that is completely surrounded by a dielectric, typically an oxide. The trapped charge establishes the threshold voltage, or $V_T$, of the device, which is sensed when the memory is read to determine the data stored therein.

An illustrative well known type of compact floating gate data cell structure is the stacked gate structure such as that disclosed in U.S. Pat. No. 5,357,465, issued Oct. 18, 1994 to Challa. A floating gate is sandwiched between two insulator layers. The top layer of the stack is a control gate electrode. The stacked gate structure overlies a channel region and parts of the source and drain regions adjacent the channel.

As is typical of nonvolatile memory cells that are capable of being repeatedly programmed and erased, the various functions of the stacked gate memory cell are controlled by applying various bias voltages. Depending to some extent on device characteristics, stacked gate transistors may be programmed by moving electrons to the floating gate using Fowler-Nordheim ("FN") tunneling or electron injection. Electron injection typically is done using channel hot electron injection ("CHE") or channel-initiated secondary electron injection ("CISEI"). FN tunneling remains a popular choice in flash memory for erase operations.

Figure 1:
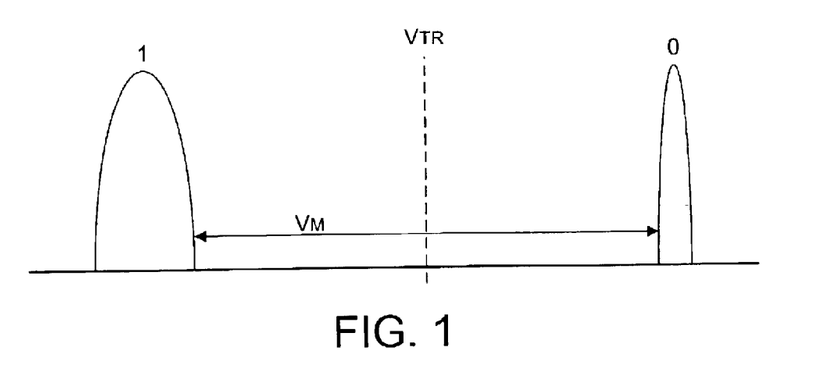
FIG. 1 is a graph showing threshold voltage distributions and the voltage margin for a two-level memory cell.

Conventionally, the single transistor cell is operated to store one of two values by having its threshold voltage $V_T$ set within one of two levels of $V_T$ distribution, as shown in FIG. 1. To read a cell is to compare the threshold voltage of the cell to the threshold voltage of a reference cell. For instance, the data cell is read out as "1" if its threshold voltage is lower than the reference threshold voltage, and is read out as "0" if its threshold voltage is higher than the reference threshold voltage. The voltage margin $V_M$ between the two levels of distribution is typically about 3 volts.

Figure 2:
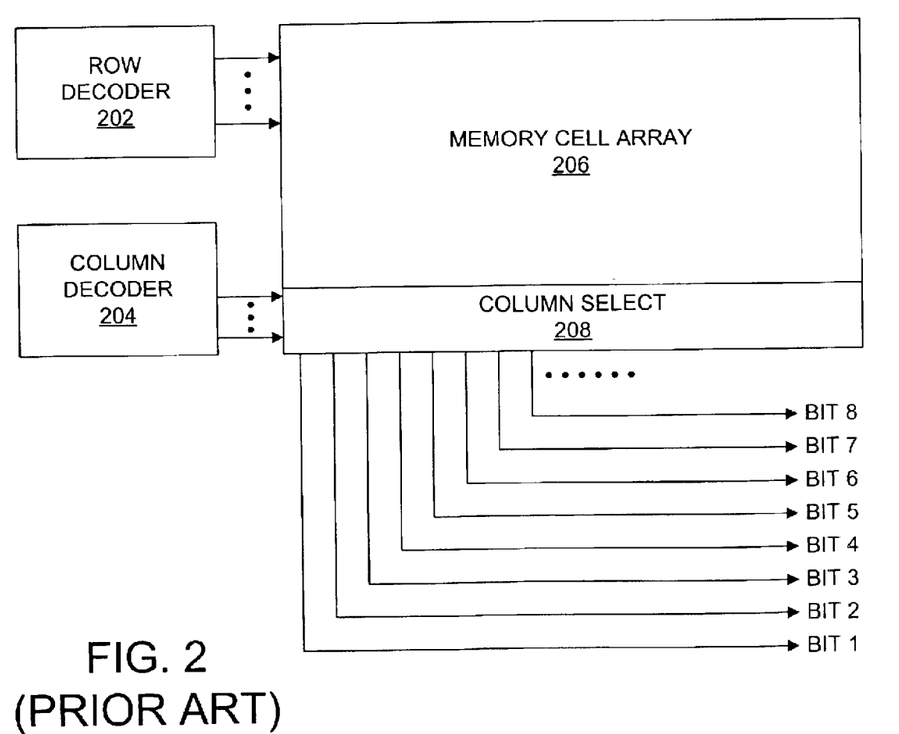
FIG. 2 is a block-level schematic diagram showing a prior art bit mapping scheme for the two-level memory cell of FIG. 1.

FIG. 2 is a block-level schematic diagram showing a prior art bit mapping scheme for the two-level memory cell of FIG. 1. The mapping scheme is a simple 1 to 1 mapping. Each memory cell of the memory cell array 206 selected by the row decoder 202, the column decoder 204, and the column selects 208 maps to one bit. Hence, eight memory cells map to BIT 1, BIT 2, BIT 3, BIT 4, BIT 5, BIT 6, BIT 7 and BIT 8. No mapping circuit is needed.

Figure 3:
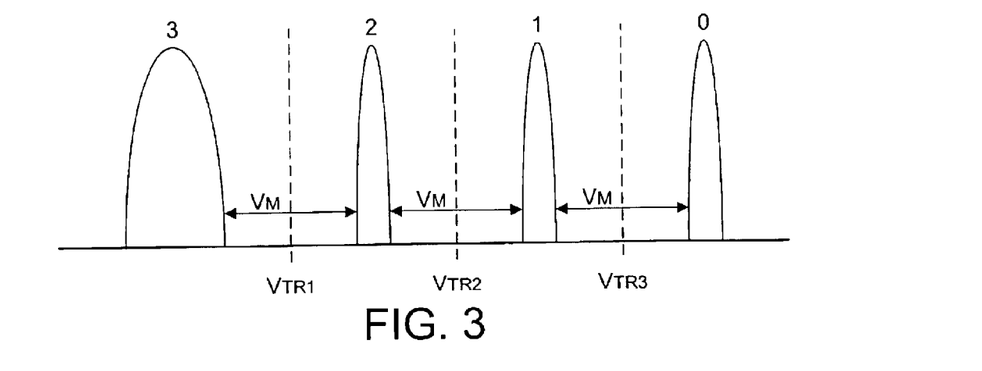
FIG. 3 is a graph showing threshold voltage distributions and voltage margins for a four-level memory cell.

Techniques are also known for achieving multiple bit storage in a single transistor nonvolatile memory cell by programming the multiple bits into a memory cell as different threshold voltage levels or in different parts of the cell. FIG. 3 shows four levels of $V_T$ distribution representing states 0, 1, 2 and 3. The use of four levels per memory cell increases the effective data density of the flash memory array without increasing its die size.

Figure 4:
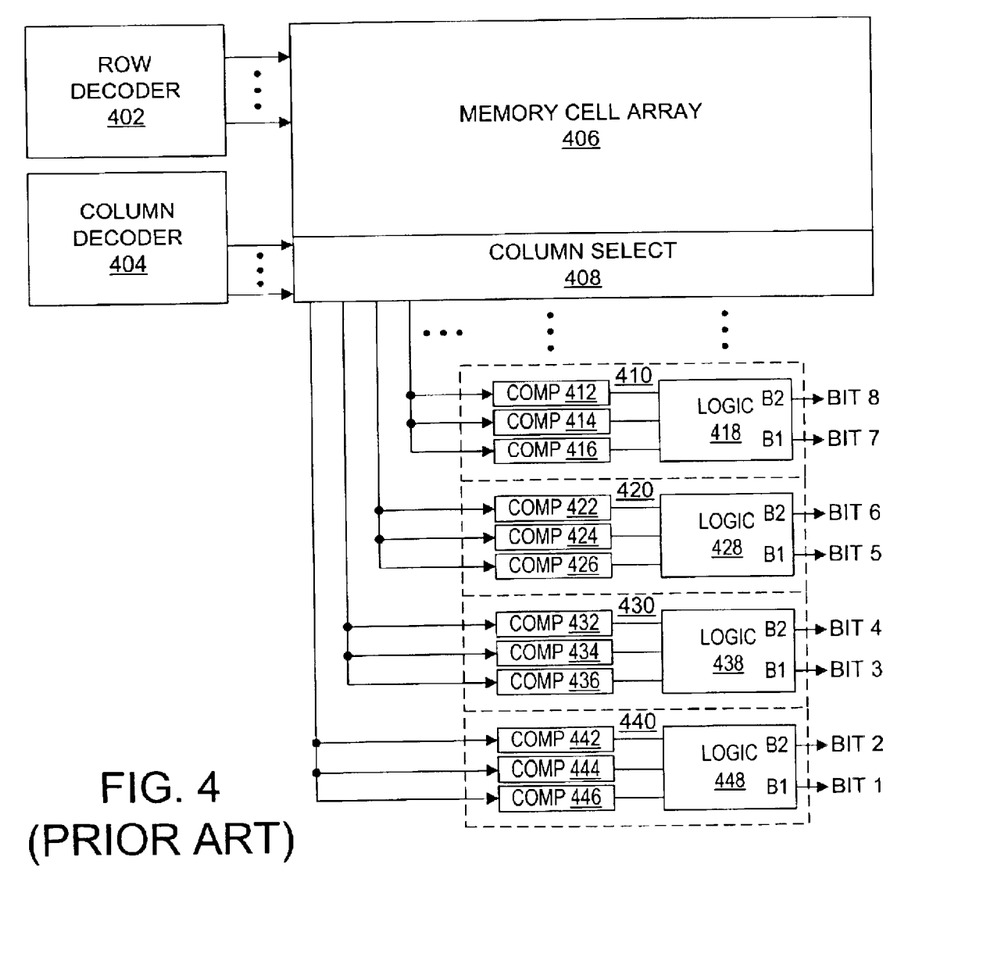
FIG. 4 is a block-level schematic diagram showing a prior art bit mapping scheme for the four-level memory cell of FIG. 3.

FIG. 4 is a block-level schematic diagram showing a prior art bit mapping scheme for the four-level memory cell of FIG. 3. The mapping scheme is a 1 to 2 mapping. Each memory cell of the memory cell array 406 selected by the row decoder 402, the column decoder 404, and the column selects 408 maps to two bits. Hence, four memory cells map to BIT 1, BIT 2, BIT 3, BIT 4, BIT 5, BIT 6, BIT 7 and BIT 8.

Each selected memory cell is mapped to two bits by a mapping circuit. FIG. 4 shows four mapping circuits 410, 420, 430 and 440 for providing a byte of data. The mapping circuit 410 performs a 1 cell to 2 bit mapping by comparing the threshold voltage of the selected memory cell with three different threshold reference voltages. The comparisons are done in parallel by comparators 412, 414 and 416, which have their inputs connected in parallel to a bit line and provide a value on their outputs that is dependent on the threshold level of the selected memory cell. Levels 0, 1, 2 and 3 may result, for example, in 000, 001, 011 and 111 respectively at the outputs of the comparators 412, 414 and 416. The outputs of comparators 412, 414 and 416 are processed in combinatorial logic circuit 418 to furnish outputs B1 (bit 1 output) and B2 (bit 2 output), the values of which are, for example, 00, 01, 10 and 11 respectively. The output B1 is considered to be BIT 7, and the output B2 is considered to be BIT 8. The mapping circuit 420 functions in a manner similar to the mapping circuit 410 to furnish BIT 5 and BIT 6 from the outputs B1 and B2 of a combinatorial logic circuit 428, which in turn receives the outputs of parallel-connected comparators 422, 424 and 426. The mapping circuit 430 functions in a manner similar to the mapping circuit 410 to furnish BIT 3 and BIT 4 from the outputs B1 and B2 of a combinatorial logic circuit 438, which in turn receives the outputs of parallel-connected comparators 432, 434 and 436. The mapping circuit 440 functions in a manner similar to the mapping circuit 410 to furnish BIT 1 and BIT 2 from the outputs B1 and B2 of a combinatorial logic circuit 448, which in turn receives the outputs of parallel-connected comparators 442, 444 and 446.

Another technique for sensing four-level memory cells is disclosed in U.S. Pat. No. 5,828,616 which issued Oct. 27, 1998 to Bauer et al. and is entitled "Sensing scheme for flash memory with multilevel cells." This technique of reading a multilevel cell is to compare the threshold voltage of the cell to a sequence of reference cell threshold voltages. Three reference threshold voltages $V_{TR1}$, $V_{TR2}$ and $V_{TR3}$ are established. First, the threshold voltage of the data cell is compared to $V_{TR1}$. If it is smaller than $V_{TR1}$, it is next compared with $V_{TR2}$. Otherwise, it is compared with $V_{TR3}$. Based on the two consecutive comparisons, the cell is read out as "11" or "10" or "01" or "00". Disadvantageously, two consecutive comparisons makes the random access time slower for this type of sensing technique, relative to the parallel sensing technique of FIG. 4.

The reliability of memories using four-level memory cells can be adversely affected because of the small voltage margin $V_M$. The voltage margin $V_M$ typically is reduced to 0.67 volts from the 3 volt margin common in conventional flash memory cell, assuming that the threshold voltage distribution width for the same state is 0.5 volts. Therefore, the difference between the threshold voltage of a data cell and the reference threshold voltage is only 0.33 volts if the reference threshold voltage is positioned in the middle of the two states. Unfortunately, electron leakage can cause a threshold voltage shift of as much as 0.5 volts, which is in excess of the difference between the threshold voltage of a data cell and the reference threshold voltage and can result in a functional failure.

A variety of memories having multilevel cells are known; see, e.g., U.S. Pat. No. 4,415,992 which issued Nov. 15, 1983 to Adlhock and is entitled "Memory system having memory cells capable of storing more than two states;" U.S. Pat. No. 5,163,021 which issued Nov. 10, 1992 to Mehrotra et al. and is entitled "Multi-state EEPROM read and write circuits and techniques;" U.S. Pat. No. 5,485,422 which issued Jan. 16, 1996 to Bauer et al. and is entitled "Drain bias multiplexing for multiple bit flash cell;" U.S. Pat. No. 5,517,138 which issued May 14, 1996 to Baltar et al. and is entitled "Dual row selection using multiplexed tri-level decoder;" U.S. Pat. No. 5,748,546 which issued May 5, 1998 to Bauer et al. and is entitled "Sensing scheme for flash memory with multilevel cells;" U.S. Pat. No. 5,754,469 which issued May 19, 1998 to Hung et al. and is entitled "Page mode floating gate memory device storing multiple bits per cell;" U.S. Pat. No. 5,828,616 which issued Oct. 27, 1998 to Bauer et al. and is entitled "Sensing scheme for flash memory with multilevel cells;" U.S. Pat. No. 5,982,667 which issued Nov. 9, 1999 to Jyouno et al. and is entitled "Nonvolatile semiconductor memory device for storing multivalue information by controlling erase and plural write states of each memory cell;" U.S. Pat. No. 6,028,792 which issued Feb. 22, 2000 to Tanaka et al. and is entitled "Multi-level memory for verifying programming results;" U.S. Pat. No. 6,052,303 which issued Apr. 18, 2000 to Chevallier et al. and is entitled "Apparatus and method for selecting data bits read from a multistate memory;" U.S. Pat. No. 6,091,631 which issued Jul. 18, 2000 to Kucera et al. and is entitled "Program/verify technique for multi-level flash cells enabling different threshold levels to be simultaneously programmed;" U.S. Pat. No. 6,181,603 which issued Jan. 30, 2001 to Jyouno et al. and is entitled "Nonvolatile semiconductor memory device having plural memory cells which store multi-value information;" U.S. Pat. No. 6,219,276 which issued Apr. 17, 2001 to Parker et al. and is entitled "Multilevel cell programming;" U.S. Pat. No. 6,259,626 which issued Jul. 10, 2001 to Pasotti et al. and is entitled "Method for storing bytes in multi level nonvolatile memory cells;" U.S. Pat. No. 6,366,496 which issued Apr. 2, 2002 to Torelli et al. and is entitled "Method for programming multi level non-volatile memories by controlling the gate voltage;" and U.S. Pat. No. 6,456,527 which issued Sep. 24, 2002 to Campardo et al. and is entitled "Nonvolatile multilevel memory and reading method thereof."

BRIEF SUMMARY OF THE INVENTION

Instead of multiple threshold levels in a memory cell that are a power of 2 (such as 4, for example) and read and program mappings are whole functions that are uniquely defined for every value within their domain, the memory of the present invention uses multiple threshold levels in a memory cell that are not a power of two, and further uses a cell mapping technique wherein the read mapping is only a partial function, i.e. either not every value in the domain is mapped or the mapping is not unique defined for every value within its domain. The domain of read states for a single three-level memory cell, for example, has three states, but only two of them can be uniquely mapped to a bit. The domain of read states for two three-level memory cell, for example, has nine states, but only eight of them can be uniquely mapped to three bits. Although the read mapping is only partial, advantageously the voltage margin $V_M$ for three-level memory cells is larger than the voltage margin available in the commonly used four-level memory cells. This increased voltage margin facilitates memory cell threshold voltage sensing, thereby increasing the reliability of the memory. Memory reliability may be further improved by increasing the voltage margin between the memory cell 0 state and the 1 state relative to the voltage margin between the 1 state and the 2 state. The increased voltage margin more effectively accommodates charge loss from the 0 state through electron leakage, the 0 state being the most vulnerable state to electron leakage.

These and other advantages are achieved singly or in combination in one or more of the embodiments of the present invention. One embodiment of the present invention is a semiconductor memory comprising an array comprising a plurality of three-level flash memory cells; a memory array access circuit coupled to the memory cell array, the memory array access circuit having a read mapping of the three-level cells to binary values that is a partial function; a row decoder coupled to the memory cell array; and a column decoder coupled to the memory array access circuit.

Another embodiment of the present invention is a semiconductor memory comprising an array comprising a plurality of three-level flash memory cells; a row decoder coupled to the memory cell array; a memory array access circuit coupled to the memory cell array and comprising a program function for mapping binary values to groupings of the three-level memory cells, and a read partial function for mapping groupings of the three-level memory cells to binary values; and a column decoder coupled to the memory array access circuit.

A further embodiment of the present invention is a semiconductor memory comprising an array comprising a plurality of three-level flash memory cells; a row decoder coupled to the memory cell array; a memory array access circuit coupled to the memory cell array, and a column decoder coupled to the memory array access circuit. The memory array access circuit comprises a program function having at least one 3 bit to 2 cell mapping and at least one 1 bit to 1 cell mapping; and a read partial function having at least one 2 cell to 3 bit mapping and at least one 1 cell to 1 bit mapping.

Another embodiment of the present invention is a semiconductor memory comprising an array comprising a plurality of three-level flash memory cells, each having a threshold voltage corresponding to one of three possible storage states 0, 1 and 2; a row decoder coupled to the memory cell array; a read mapping circuit; and a column decoder coupled to the read mapping circuit. The read mapping circuit comprises a first threshold reference voltage generator for furnishing a reference voltage within a first voltage margin between the 2 state and the 1 state; a first comparator coupled to the first threshold reference voltage generator for comparing the threshold voltage of a selected one of the memory cells of the array against the first threshold reference voltage and providing an output indicative thereof; a second threshold reference voltage generator for furnishing a reference voltage within a second voltage margin between the 1 state and the 0 state, the second voltage margin being different than the first voltage margin; a second comparator coupled to the second threshold reference voltage generator for comparing the threshold voltage of the selected memory cell against the second threshold reference voltage and providing an output indicative thereof; and a combinatorial logic circuit for mapping the outputs of the first and second comparators to binary values.

A further embodiment of the present invention is a semiconductor memory comprising an array comprising a plurality of three-level flash memory cells; a row decoder coupled to the memory cell array by a plurality of row lines having row line drivers, a first group of the memory cells being coupled to the row lines in proximity to the row line drivers and a second group of the memory cells being coupled to the row lines remote from the word line drivers; a read circuit for mapping groupings of the three-level memory cells to binary values using a partial function, the read circuit having at least one input selectively coupled to a memory cell in the first group and at least one input selectively coupled to a memory cell in the second group; and a column decoder coupled to the read circuit.

Yet another embodiment of the present invention is a method of reading a semiconductor memory comprising a plurality of three-level flash memory cells, the method comprising selecting a first one of the memory cells; determining a storage state of the first memory cell from a threshold voltage thereof, the determined storage state of the first memory cell being one of three possible storage states; and mapping the determined storage state of the first memory cell to a binary value with a partial function.

A further embodiment of the present invention is a method of programming a semiconductor memory comprising a plurality of three-level flash memory cells, the method comprising selecting a first plurality of the memory cells; mapping a plurality of binary bits to respective storage states for the first plurality of memory cells, each of the storage states being one of three possible storage states; and programming the first plurality of memory cells with the storage states.

Another embodiment of the present invention is a method of operating a semiconductor memory comprising a plurality of three-level flash memory cells. The method comprises selecting a first plurality of the memory cells for programming; mapping a multiple-bit binary value to respective storage states for the first plurality of memory cells, each of the storage states being one of three possible storage states; programming the first plurality of memory cells to have threshold voltages corresponding to the storage states; selecting a second plurality of the memory cells from the first plurality of memory cells for reading; determining respective storage states of the selected second plurality of memory cell from the threshold voltage thereof; and mapping the determined storage states of the second plurality of memory cells to a multiple-bit binary value.

A further embodiment of the present invention is a method of reading a semiconductor memory comprising a plurality of three-level flash memory cells. The method comprises selecting some of the memory cells, each of the selected memory cells having a threshold voltage corresponding to one of three possible storage states 0, 1 and 2; for each of the selected memory cells, comparing the threshold voltage thereof against a first threshold reference voltage and a second threshold reference voltage, the first threshold reference voltage being set within a first voltage margin between the 2 state and the 1 state, and the second threshold reference voltage being set within a second voltage margin between the 1 state and the 0 state; and mapping the selected memory cells to a binary value from results of the comparing step.

DETAILED DESCRIPTION OF THE INVENTION, INCLUDING THE BEST MODE

A memory has an array of preferably three-level memory cells, comparators for detecting the levels actually stored in selected cells, and a bit mapping circuit that maps the cells to bits using a partial function.

Figure 5:
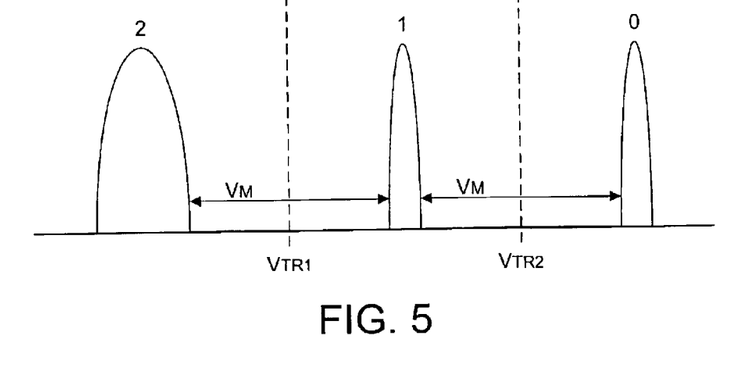
FIG. 5 is a graph showing threshold voltage distributions and voltage margins for a three-level memory cell.

FIG. 5 is a graph showing an illustrative threshold voltage distribution for a three-level memory cell. The voltage margin $V_M$ between the states 0 and 1 and the states 1 and 2 is about 1.25 volts, assuming that the threshold voltage $V_T$ distribution width for state 1 is 0.5 volts, and that the threshold voltage gap between state 0 and state 2 is 3 volts. If the sensing threshold reference voltage $V_{TR}$ is positioned in the middle between two adjacent states, the difference between the edge of each cell's threshold voltage distribution and the sensing threshold reference voltage $V_{TR}$ (the "sensing margin") is 0.625 volts.

As is apparent from a comparison of the graph of FIG. 5 with the graph of FIG. 3, the voltage margin $V_M$ of the three-level, 1.5 bit memory cell is increased relative to the voltage margin commonly found in four level, two bit approach. In the four level approach, the voltage margin $V_M$ is reduced to 0.67 volts from the 3 volt margin common in conventional flash memory cell, and the difference between the edge of each cell's threshold voltage distribution and the sensing threshold reference voltage $V_{TR}$ is only 0.33 volts. Hence, threshold voltage shifts of as much as 0.5 volts due to electron leakage can result in a functional failure when sensing the four-level memory cell. In the three level approach, by comparison, the difference between the edge of each cell's threshold voltage distribution and the sensing threshold reference voltage $V_{TR}$ is 0.625 volts. Hence, threshold voltage shifts of as much as 0.5 volts due to electron leakage do not cause such functional failures in memories that use three-level memory cells. As a result, the reliability of a memory using three-level memory cells is improved relative to the reliability of a memory using four-level memory cells, all else being equal.

While the voltage margin $V_M$ of the three-level, 1.5 bit memory cell is decreased relative to the voltage margin commonly found in the two-level, one bit approach, as is apparent from a comparison of the graph of FIG. 5 with the graph of FIG. 1, the reduction is not harmful. The voltage margin $V_M$ of the three-level, 1.5 bit memory cell is reduced to 1.25 volts from the 3 volt margin common in conventional flash memory cell, but the difference between the edge of each cell's threshold voltage distribution and the sensing threshold reference voltage $V_{TR}$ is a relatively large 0.625 volts. Hence, threshold voltage shifts of as much as 0.5 volts due to electron leakage cannot result in a functional failure when sensing the three-level memory cell. As a result, the reliability of a memory using three-level memory cells is not degraded relative to the reliability of a memory using two-level memory cells, all else being equal.

Figure 6:
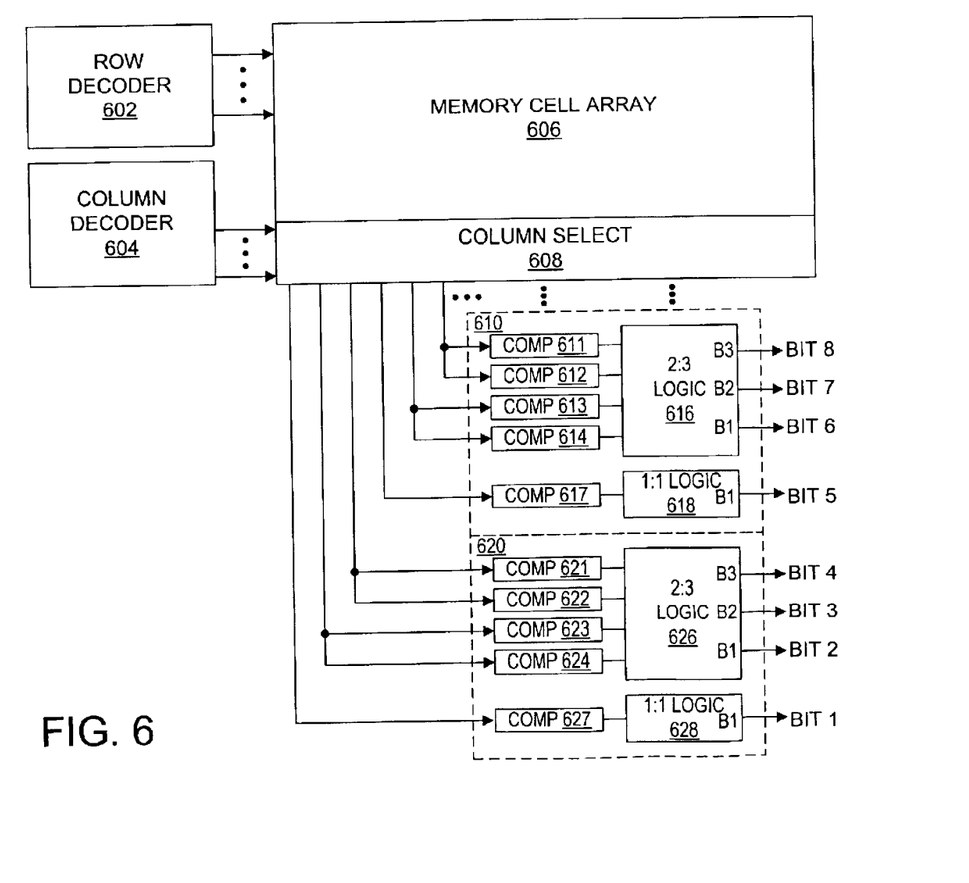
FIG. 6 is a block-level schematic diagram showing a bit mapping scheme for the three-level memory cell of FIG. 5.

FIG. 6 is a block-level schematic diagram showing an illustrative bit mapping scheme for reading the three-level memory cell of FIG. 5. The basic mapping scheme is a combination of a 2 to 3 mapping for two three-level memory cells and a 1 to 1 mapping for one three-level memory cell. Two mapping circuits 610 and 620 are used to obtain a byte, each mapping circuit having a 2 to 3 mapping circuit and a 1 to 1 mapping circuit. Hence, three selected memory cells map to BIT 1, BIT 2, BIT 3 and BIT 4 while three other selected memory cells map to BIT 5, BIT 6, BIT 7 and BIT 8. Although FIG. 6 shows read mapping, the mapping is carried out in reverse for write mapping.

Illustratively, the mapping circuit 610 includes two parallel-connected comparators for each of two bit line inputs, and a fifth comparator for a third bit line input. Comparators 611 and 612, for example, have their inputs connected in parallel to one bit line and provide a value on their outputs that is dependent on the threshold level of the selected memory cell. Levels 0, 1 and 2 may result, for example, in 00, 01 and 11 respectively at the outputs of the comparators 611 and 612. Similarly, comparators 613 and 614 have their inputs connected in parallel to one bit line and provide signals 00, 01 or 11 respectively at their outputs. A fifth comparator 617 has its input connected to another a bit line and provide a signal 0 or 1 at its output, depending on the stored state of the selected memory cell.

The outputs of comparators 611, 612, 613 and 614 are processed in combinatorial logic circuit 616 to generate three output bits B1, B2 and B3. Output B1 is considered to be BIT 6, output B2 is considered to be BIT 7, and output B3 is considered to be BIT 8. The output of comparator 617 is processed in combinatorial logic circuit 618 to generate one output bit B1. Output B1 is considered to be BIT 5.

The mapping circuit 620 functions in a manner similar to the mapping circuit 610 to furnish BIT 2, BIT 3, and BIT 4 from the outputs B1, B2 and B3 of a combinatorial logic circuit 626, which in turn receives the outputs of parallel-connected comparators 621, 622, 623 and 624. BIT 1 is furnished from the output B1 of combinatorial logic circuit 628, which in turn receives the output of comparator 627.

The mapping of three-level memory cells is now explained in more detail and in greater breadth with reference to the tables of FIG. 7, FIG. 8, FIG. 9, FIG. 10 and FIG. 11.

Figure 7:
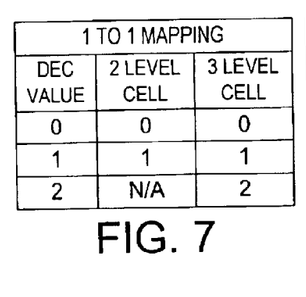
FIG. 7 is a table showing a 1 to 1 mapping of a three-level flash cell to a two-level flash cell.

FIG. 7 is a table showing a 1 to 1 mapping of a three-level flash cell to a two-level flash cell. In a 1 to 1 mapping, the use of a three-level memory cell does not improve the effective memory array density. However, the 1 to 1 mapping may be combined with other mappings to obtain a composite mapping to a useful bit grouping.

One to one mapping is used in the circuit of FIG. 6. In the mapping circuit 610, comparator 617 illustratively outputs 0 for state 0 and 1 for state 1, and the logic circuit 618 converts the output from the comparator 617 into the bit B1 using any suitable technique, preferably any suitable arrangement of logic gates in a manner known to one of ordinary skill. While the state 2 is unmapped, it will be appreciated that the mapping shown in FIG. 7 is illustrative, and any combination of 2 of the 3 states can be mapped to the 1 bit of the two-level memory cell.

Figure 8:
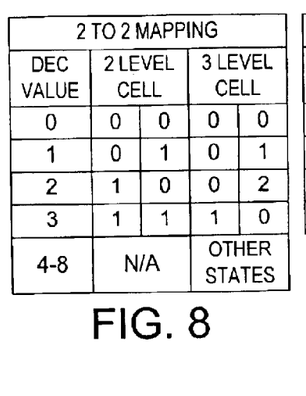
FIG. 8 is a table showing a 2 to 2 mapping of two three-level flash cells to two two-level flash cells.

FIG. 8 is a table showing a 2 to 2 mapping of two three-level flash cells to two two-level flash cells. In a 2 to 2 mapping, the use of a three-level memory cell does not improve the effective memory array density. However, the 2 to 2 mapping may be combined with other mappings to obtain a composite mapping to a useful bit grouping.

Figure 9:
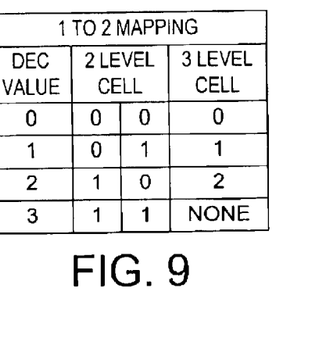
FIG. 9 is a table showing a 1 to 2 mapping of a three-level flash cell to two bits, i.e. two two-level flash cells.

FIG. 9 is a table showing a 1 to 2 mapping of a three-level flash cell to two two-level flash cells. Although a 1 to 2 mapping is suitable for a four-level memory cell, it is not suitable for a three-level memory cell since at least one binary value, in FIG. 9 the binary value 11, cannot be represented.

Figure 10:
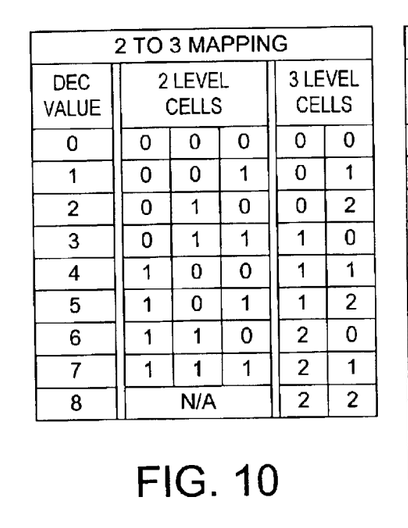
FIG. 10 is a table showing an illustrative 2 to 3 mapping of two three-level flash cells to three bits, i.e. three two-level flash cells.

FIG. 10 is a table showing an illustrative 2 to 3 mapping of two three-level flash cells to three bits, i.e. three two-level flash cells. In conventional manner, the states of the three two-level cells map to decimal values as follows: 000 represents 0, 001 represents 1, 010 represents 2, 011 represents 3, 100 represents 4, 101 represents 5, 110 represents 6, and 111 represents 7. Illustratively, the states of the two three-level memory cells map to decimal values 0 through 7 as follows: 00 represents 0, 01 represents 1, 02 represents 2, 10 represents 3, 11 represents 4, 12 represents 5, 20 represents 6, and 21 represents 7. In this example, state 22 is not mapped; hence the partial mapping.

Two to three mapping is used in the circuit of FIG. 6. Where two comparators are used per bit line (for example, comparators 611 and 612, comparators 613 and 614, comparators 621 and 622, and comparators 623 and 624 (FIG. 6)), they output 00 for state 0, 01 for state 1, and 11 for state 2, and the logic circuit associated with these comparators (for example, logic circuit 616 is associated with comparators 611, 612, 613 and 614; and logic circuit 626 is associated with comparators 621, 622, 623 and 624 (FIG. 6)) convert the outputs of the comparators into the three bits B1, B2 and B3 using any suitable technique, preferably any suitable arrangement of logic gates in a manner known to one of ordinary skill. While the state 2,2 is unmapped, it will be appreciated that the mapping shown in FIG. 10 is illustrative, and any combination of 8 of the 9 states can be mapped to the 3 bits of the two-level memory cells, and that redundant mappings may be used if desired.

Figure 11:
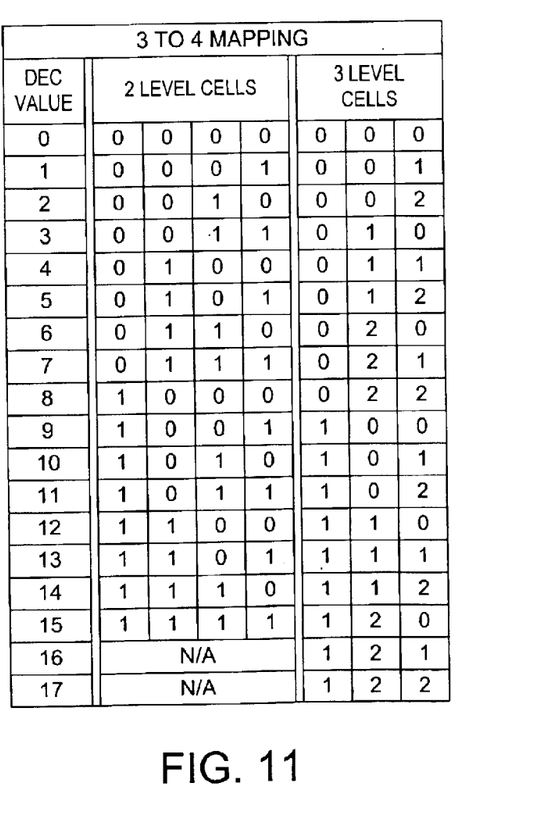
FIG. 11 is a table showing an illustrative 3 to 4 mapping of three three-level flash cells to four bits, i.e. four two-level flash cells.

FIG. 11 is a table showing an illustrative 3 to 4 mapping of three three-level flash cells to four bits, i.e. four two-level flash cells. In conventional manner, the states of the four two-level cells map to decimal values as follows: 0000 represents 0, 0001 represents 1, 0010 represents 2, 0011 represents 3, 0100 represents 4, 0101 represents 5, 0110 represents 6, 0111 represents 7, 1000 represents 8, 1001 represents 9, 1010 represents 10, 1011 represents 11, 1100 represents 12, 1101 represents 13, 1110 represents 14, and 1111 represents 15. The decimal values of 16, 17 and 18–26 (not shown) cannot be represented by the four two-level cells. Illustratively, the states of the three three-level memory cells map to decimal values 0 through 15 as follows: 000 represents 0, 001 represents 1, 002 represents 2, 010 represents 3, 011 represents 4, 012 represents 5, 020 represents 6, 021 represents 7, 022 represents 8, 100 represents 9, 101 represents 10, 102 represents 11, 110 represents 12, 111 represents 13, 112 represents 14, and 120 represents 15. Two comparators are used to sense the state of a selected cell.

As may be observed from the table of FIG. 11, the leftmost three-level memory cell in the particular mapping shown is restricted to one of just two states, a 0 state and a 1 state. This cell is not programmed into the 2 state. Under these circumstances, only one comparator is required to sense the state of a selected cell.

Figure 12:
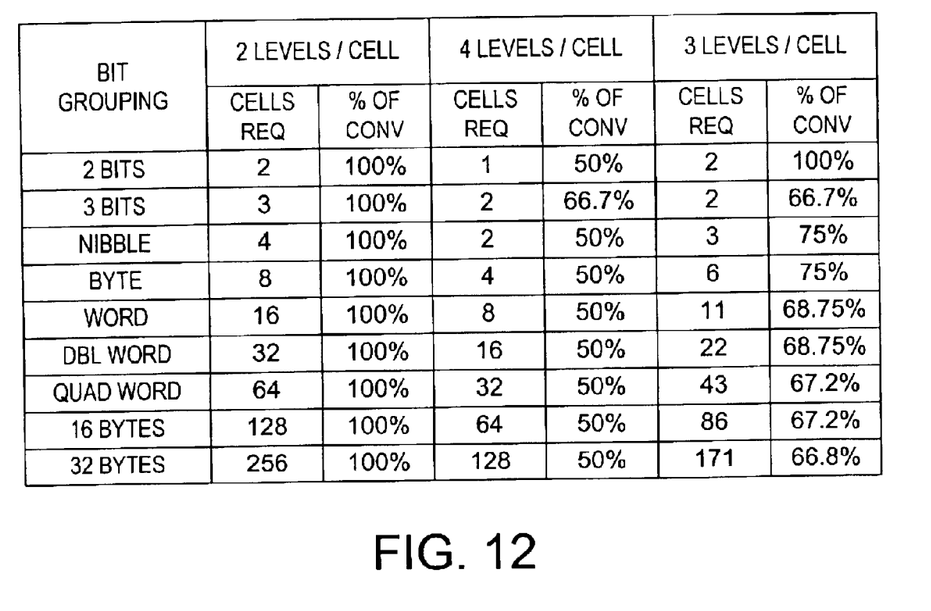
FIG. 12 is a table showing the approximate reduction in the number of memory cells required to store a given amount of data, for four-level flash cells and three-level flash cells relative to two-level flash cells and as a function of particular bit groupings.

FIG. 12 is a table showing the approximate reduction in the number of memory cells required to store a given amount of data, for four-level flash cells and three-level flash cells relative to two-level flash cells and as a function of particular bit groupings. The particular bit groupings included in the table are: two bit group, three bit group, nibble, byte, word, double word, quad word, 16 byte group, and 32 byte group, to name just a few possible groupings. Mapping of the three-level cells may be as shown in FIG. 7, FIG. 8, FIG. 9, FIG. 10 and FIG. 11, or in any other desired scheme. Except for the mappings involving fractional bits, the reduction achieved by the four-level memory cell is always 50%, regardless of the size of the bit grouping. The reduction for mappings involving fractional bits is smaller, suggesting that such mappings are disadvantageous and should be avoided. Suitable mappings for a four-level cell involve only whole bit mapping, such as a 1 cell to 2 bit mapping, or a multiple thereof such as 2 to 4, or 4 to 8. This is why the decoding logic for four-level cells typically is designed around one cell and replicated as many times as there are cells to be decoded in parallel. In contrast, the reduction achieved with use of three-level memory cells varies with the size of the bit grouping. For a grouping of 2 bits, no reduction is achieved—the number of three-level memory cells required for 2 bit grouping is 100% of the number of two-level memory cells required, namely two cells, and the mapping is a 2 to 2 mapping as shown in the table of FIG. 8. However, a significant and progressive reduction in the number of three-level memory cells required to store a given amount of data relative to two-level flash cells is seen for groupings larger than 2 bits, and the mapping varies as well.

Illustrative mappings based on 2 to 3 mapping for three-level cells in various common groupings are as follows: one 2 to 3 mapping and one 1 to 1 mapping for a nibble, two 2 to 3 mappings and one 2 to 2 mapping for a byte, five 2 to 3 mappings and one 1 to 1 mapping for a word, ten 2 to 3 mappings and one 2 to 2 mapping for a double word, twenty-one 2 to 3 mappings and one 1 to 1 mapping for a quad-word, forty-two 2 to 3 mappings and one 2 to 2 mapping for a 16 byte group, and eighty-one 2 to 3 mappings and one 1 to 1 mapping for a 32 byte group.

Other mappings are possible as well, including the following: 3 to 4 mapping for a nibble or byte (the byte mapping 6 to 8 being a multiple), 11 to 16 mapping for a word or double-word (the double-word mapping 22 to 32 being a multiple), 43 to 64 mapping for a quad-word and for a 16 byte grouping (the 16 byte grouping mapping 86 to 128 being a multiple), and 171 to 256 mapping for a 32 byte grouping.

Although the use of three-level memory cells does not permit as great a density increase in the memory array itself as is possible with the use of four-level memory cells, the density advantage resulting from the use of four-level memory cells is somewhat offset by the larger and more complicated sensing circuits required for the four-level memory cells. The sensing circuits for the four-level memory cells uses more comparators and threshold voltage generators, and must be designed to operate within a smaller voltage margin.

Figure 13:
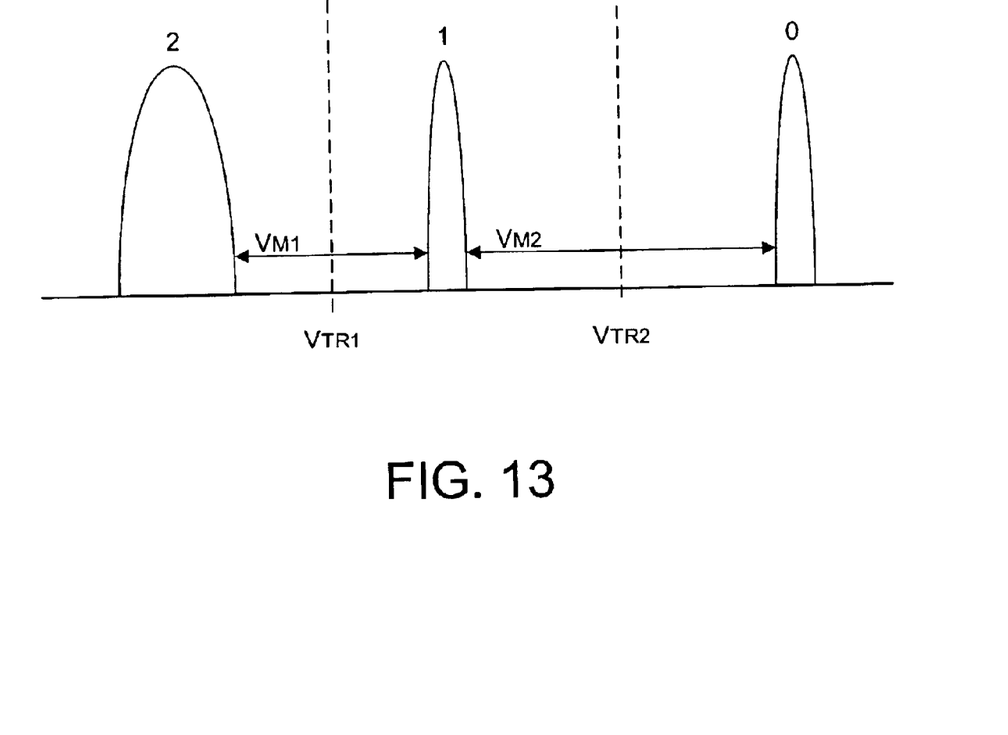
FIG. 13 is a graph showing threshold voltage distributions and unequal voltage margins for a three-level memory cell.

Memory tolerance to charge loss from the 0 state through electron leakage may be further improved by increasing the voltage margin $V_{M2}$ between the memory cell 0 state and the 1 state relative to the voltage margin $V_{M1}$ between the 1 state and the 2 state. FIG. 13 is a graph showing threshold voltage distributions for the 0, 1 and 2 states, and a voltage margin $V_{M2}$ between the memory cell 0 state and the 1 state that is greater than the voltage margin $V_{M1}$ between the 1 state and the 2 state. The increased voltage margin $V_{M2}$ relative to the voltage margin $V_{M1}$ more effectively accommodates charge loss from the 0 state through electron leakage, the 0 state being the most vulnerable state to electron leakage.

Memory tolerance to ground noise may be improved by using read redundancy in the mapping. Noise on the internal ground bus occurs when a data output switches from "high" to "low." If multiple outputs switch together from "high" to "low," the noise on the internal ground bus increases. Internal ground bus noise can on occasion be of a sufficient magnitude to cause a functional failure when an erased cell is being read. The functional failure occurs because a voltage overshoot on the internal ground bus reduces the current sensed from an erased cell. A similar problem can occur on the $V_{CC}$ line when multiple data outputs switch together from "low to high," although typically not to as great a degree.

Figure 14:
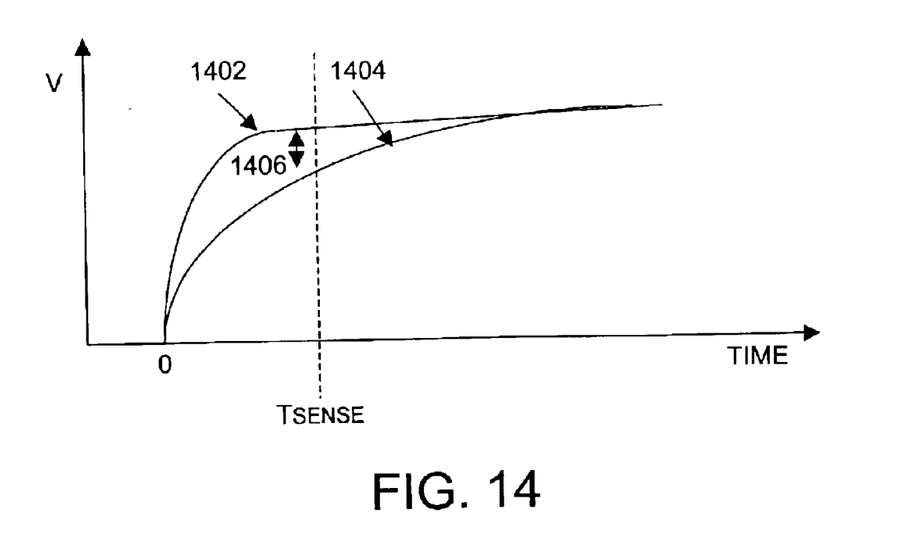
FIG. 14 is a graph showing two waveforms for respective word lines of a memory.

The adverse impact of ground noise (and $V_{CC}$ noise) is particularly severe when reading cells distant from the word line driver. The reason is because their cell current is already relatively low due to lower read gate voltage. FIG. 14 is a graph showing two waveforms 1402 and 1404 for respectively the beginning and end of a selected word line of a memory, and is useful for understanding why the cell current is relatively low for the memory cells at the end of the word line, distant from the word line driver. When a word line is selected, an RC or resistance/capacitance delay between the beginning of the selected word line and the end of the selected word line affects the voltage along the word line. Word line voltage rises rapidly at the beginning of the word line and essentially reaches its full potential before the time $T_{SENSE}$ when the memory cells along the selected word line are sensed. However, word line voltage rises relatively slowly at the end of the word line due to the RC delay, and in some designs can fail to reach its full potential before the time $T_{SENSE}$ when the memory cells along the selected word line are sensed. The memory cells at the end of the word line therefore have less cell read current than the memory cells at the beginning of the word line, as shown by the voltage difference 1406. Hence, the memory cells at the end of the word line are less tolerant to noise on the internal ground bus.

Figure 15:
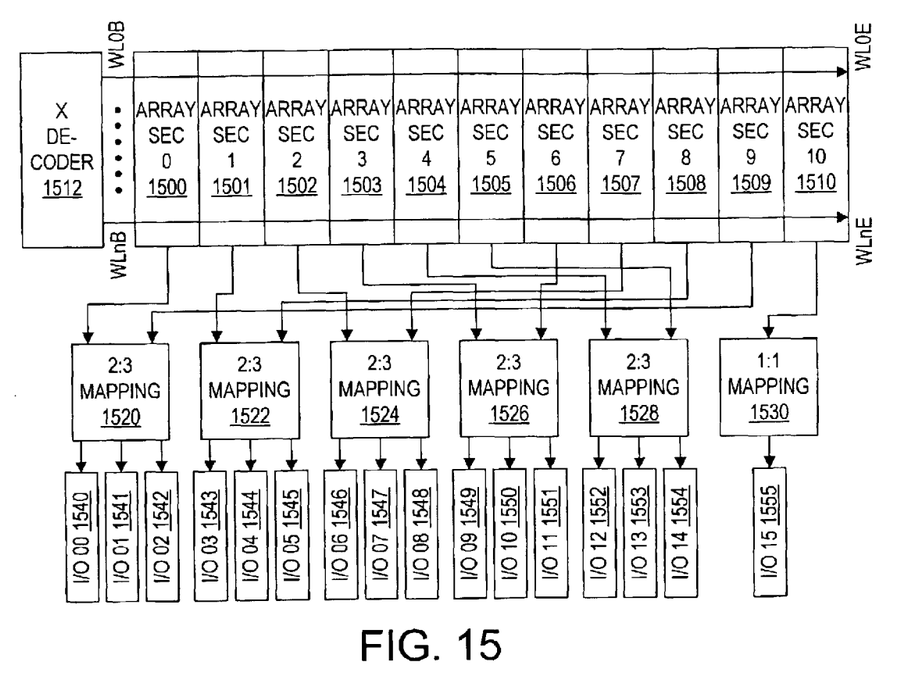
FIG. 15 is a block-level schematic diagram showing a memory architecture having five mapping circuits for reading a word, four being two cell to three bit mapping circuits and one being a one cell to one bit mapping circuit.

FIG. 15 is a block-level schematic diagram showing a memory architecture for a word bit grouping, which is represented by I/O 00 1540 through I/O 15 1555. The architecture includes a memory array having eleven array sections 1500 through 1510, five 2 to 3 mapping circuits 1520, 1522, 1524, 1526 and 1528, and one 1 to 1 mapping circuit 1530. The one column line for the 1 to 1 mapping circuit 1530 is from the least significant bit array 1510. The two column lines for the 2 to 3 mapping circuit 1520 are from respectively the most significant bit array 1500 and the next least significant bit array 1509. Following a similar pattern, the two column lines for the 2 to 3 mapping circuit 1522 are from respectively the array 1501 and the array 1508, the two column lines for the 2 to 3 mapping circuit 1524 are from respectively the array 1502 and the array 1507, the two column lines for the 2 to 3 mapping circuit 1526 are from respectively the array 1503 and the array 1506, and the two column lines for the 2 to 3 mapping circuit 1528 are from respectively the array 1504 and the array 1505.

Figure 16:
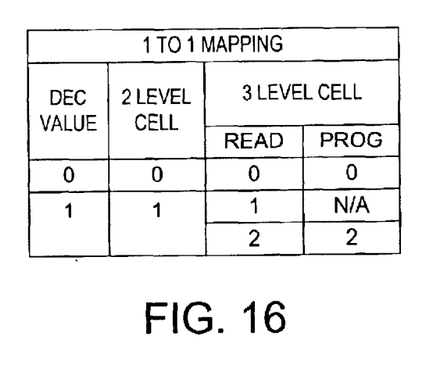
FIG. 16 is a table showing a mapping suitable for the memory architecture of FIG. 5, the mapping being between one three-level flash cell and one bit and being different for read than for program.

FIG. 16 is a table showing 1 to 1 mapping for read and program, wherein the mapping is modified to improve read reliability. For three-level memory cells in the least significant memory cell array 1510, the states 1 and 2 are both mapped to a binary 1 for reading, but when programming a binary 1, the 1 is always mapped to state 2. The lowest order cell therefore has a greater voltage margin when sensing the data.

Alternatively, the three-level memory cells in the least significant memory cell array 1510 may be operated as conventional two-level memory cells. Such cells would also have a greater voltage margin when sensing the data.

Figure 17:
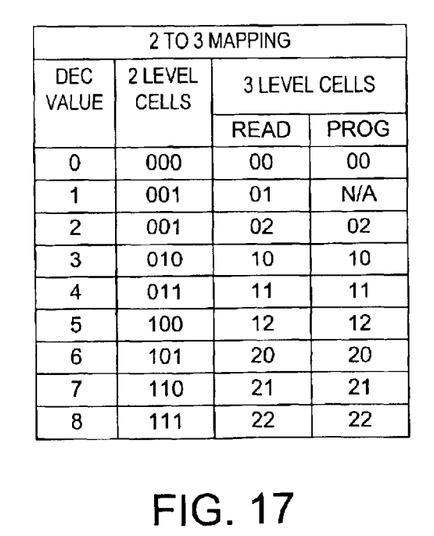
FIG. 17 is a table showing a mapping suitable for the memory architecture of FIG. 15, the mapping being between two three-level flash cell and three bits and being different for read than for program.

FIG. 17 is a table showing 2 to 3 mapping for read and program, wherein the mapping is modified to improve read reliability. For each pair of selected three-level memory cells, the memory cell in the lower significant bit position has states 01 and 02 both mapped to 001 for reading. When programming a binary 001, the 001 is always mapped to state 02. The lower order cell therefore has a greater voltage margin when sensing the data. This unsymmetrical mapping between Read and Program for the worst case Read condition shown in FIGS. 16 and 17, and arranging the two bit pair as shown in FIG. 15 allow a fast access time to be maintained with sufficient immunity against ground noise due to multiple I/O switching from "high" to "low."

The principle described above for 2 to 3 mapping may be applied to other mappings, including the 3 to 4 mapping shown in the table of FIG. 11 and the other mappings listed in the table of FIG. 12. These principles may also be used to improve immunity against $V_{CC}$ noise due to multiple I/O switching from "low" to "high."

Figure 18:
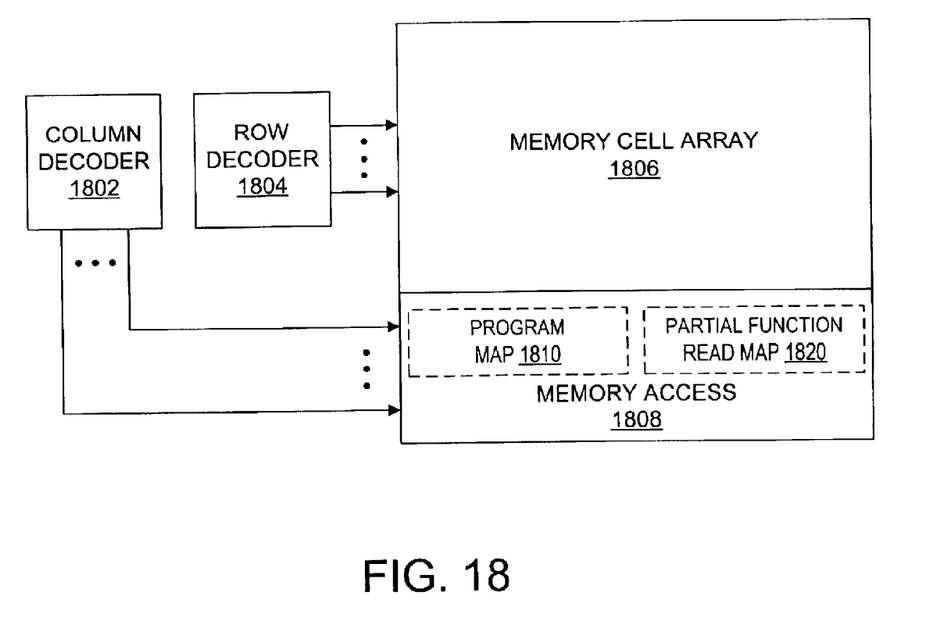
FIG. 18 is a block-level schematic diagram showing a memory architecture having a memory array access circuit.

FIG. 18 is a block-level schematic diagram showing a memory architecture having a memory cell array 1806 and a memory array access circuit 1808. A row decoder 1804 controls the selection of rows of the memory cell array 1806, and a column decoder controls the programming or reading of selected columns by the memory array access circuit 1808. The row decoder 1804 and the column decoder 1802 may be implemented in any desired way, a variety of suitable implementations being well known in the art. Moreover, the memory array access circuit 1808 may be implemented in any desired way, either in separate read and program circuits, or in read and program circuits that have some separate components and data paths but that have components and data paths in common, or in fully integrated read and program circuits. A variety of suitable memory array access circuit implements without the program mapping circuit 1810 and the partial function read mapping circuit 1820 are well known in the art.

The description of the invention and its applications as set forth herein is illustrative and is not intended to limit the scope of the invention. Variations and modifications of the embodiments disclosed herein are possible, and practical alternatives to and equivalents of the various elements of the embodiments will be apparent to those of ordinary skill in the art from a reading of this detailed description. These and other variations and modifications of the embodiments disclosed herein may be made without departing from the scope and spirit of the invention.

What is claimed is:

1. A semiconductor memory comprising:
   an array comprising a plurality of three-level flash memory cells;
   a memory array access circuit coupled to the memory cell array, the memory array access circuit having a read mapping of the three-level cells to binary values that is a partial function;
   a row decoder coupled to the memory cell array; and
   a column decoder coupled to the memory array access circuit.

2. The memory of claim 1 wherein the memory array access circuit comprises at least one 2 cell to 3 bit read mapping circuit.

3. The memory of claim 2 wherein the memory array access circuit further comprises at least one 3 bit to 2 cell program mapping circuit.

4. The memory of claim 2 wherein the memory array access circuit further comprises a 1 cell to 1 bit mapping circuit.

5. The memory of claim 4 wherein the memory array access circuit further comprises:
   at least one 3 bit to 2 cell program mapping circuit; and
   a 1 bit to 1 cell program mapping circuit.

6. The memory of claim 2 wherein the memory array access circuit further comprises a 2 cell to 2 bit mapping circuit.

7. The memory of claim 6 wherein the memory array access circuit further comprises:
   at least one 3 bit to 2 cell program mapping circuit; and
   a 2 bit to 2 cell program mapping circuit.

8. A semiconductor memory comprising:
   an array comprising a plurality of three-level flash memory cells;
   a row decoder coupled to the memory cell array;
   a memory array access circuit coupled to the memory cell array and comprising a program function for mapping binary values to groupings of the three-level memory cells, and a read partial function for mapping groupings of the three-level memory cells to binary values; and
   a column decoder coupled to the memory array access circuit.

9. The semiconductor memory of claim 8 wherein:
   the program function comprises at least one 3 bit to 2 cell mapping; and the read partial function comprises at least one 2 cell to 3 bit mapping.

10. The semiconductor memory of claim 8 wherein the program function and the read partial function are symmetrical mappings.

11. The semiconductor memory of claim 8 wherein the program function and the read partial function are asymmetrical mappings.

12. The semiconductor memory of claim 8 wherein the program function and the read partial function are asymmetrical mappings for reducing ground bus noise sensitivity, the program mapping comprising 000:00, 001:02, 010:10, 011:11, 100:12, 101:20, 110:21, and 111:22; and the read mapping comprising 00:000, 01:001, 02:001, 10:010, 11:011, 12:100, 20:101, 21:110, and 22:111.

13. A semiconductor memory comprising:
an array comprising a plurality of three-level flash memory cells;
a row decoder coupled to the memory cell array;
a memory array access circuit coupled to the memory cell array and comprising:
 a program function having a 3 bit to 2 cell mapping and a 1 bit to 1 cell mapping; and
 a read partial function having a 2 cell to 3 bit mapping and a 1 cell to 1 bit mapping; and
a column decoder coupled to the memory array access circuit.

14. A semiconductor memory comprising:
an array comprising a plurality of three-level flash memory cells, each having a threshold voltage corresponding to one of three possible storage states 0, 1 and 2;
a row decoder coupled to the memory cell array;
a read mapping circuit having:
 a first threshold reference voltage generator for furnishing a reference voltage within a first voltage margin between the 2 state and the 1 state;
 a first comparator coupled to the first threshold reference voltage generator for comparing the threshold voltage of a selected one of the memory cells of the array against the first threshold reference voltage and providing an output indicative thereof;
 a second threshold reference voltage generator for furnishing a reference voltage within a second voltage margin between the 1 state and the 0 state, the second voltage margin being different than the first voltage margin;
 a second comparator coupled to the second threshold reference voltage generator for comparing the threshold voltage of the selected memory cell against the second threshold reference voltage and providing an output indicative thereof; and
 a combinatorial logic circuit for mapping the outputs of the first and second comparators to binary values; and
a column decoder coupled to the read mapping circuit.

15. The memory of claim 14 wherein the second voltage margin is greater than the first voltage margin.

16. A semiconductor memory comprising:
an array comprising a plurality of three-level flash memory cells;
a row decoder coupled to the memory cell array by a plurality of row lines having row line drivers, a first group of the memory cells being coupled to the row lines in proximity to the row line drivers and a second group of the memory cells being coupled to the row lines remote from the word line drivers;
a read circuit for mapping groupings of the three-level memory cells to binary values using a partial function, the read circuit having at least one input selectively coupled to a memory cell in the first group and at least one input selectively coupled to a memory cell in the second group; and
a column decoder coupled to the read circuit.

17. The semiconductor memory of claim 16:
further comprising a program circuit coupled to the memory cell array for mapping binary values to groupings of the three-level memory cells;
wherein the program circuit and the read circuit comprise asymmetrical mappings.

18. The semiconductor memory of claim 17 wherein:
the program circuit comprises a 3 bit to 2 cell mapping; and
the read circuit comprises a 2 cell to 3 bit mapping.

19. The semiconductor memory of claim 18 wherein:
the mapping of the program circuit comprises 000:00, 001:02, 010:10, 011:11, 100:12, 101:20, 110:21, and 111:22; and
the mapping of the read circuit comprises 00:000, 01:001, 02:001, 10:010, 11:011, 12:100, 20:101, 21:110, and 22:111.

20. A method of reading a semiconductor memory comprising a plurality of three-level flash memory cells, the method comprising:
selecting a first one of the memory cells;
determining a storage state of the first memory cell from a threshold voltage thereof, the determined storage state of the first memory cell being one of three possible storage states; and
mapping the determined storage state of the first memory cell to a binary value with a partial function.

21. The method of claim 20 further comprising:
selecting a second one of the memory cells; and
determining a storage state of the second memory cell from a threshold voltage thereof, the determined storage state of the second memory cell being one of three possible storage states;
wherein the mapping step further comprises mapping the determined storage state of the second memory cell along with the determined storage state of the first memory cell at least in part in a 2 cell to 3 bit mapping.

22. The method of claim 21 further comprising:
selecting a third one of the memory cells;
determining a storage state of the third memory cell from a threshold voltage thereof; and
mapping the determined storage state of the third memory cell to a binary value;
wherein the third memory cell mapping step is performed at least in part in a 1 cell to 1 bit mapping.

23. The method of claim 20 further comprising:
selecting a second one of the memory cells;
determining a storage state of the second memory cell from a threshold voltage thereof, the determined storage state of the second memory cell being one of three possible storage states; and
mapping the determined storage state of the second memory cell to a binary value with a partial function;
wherein the first memory cell mapping step and the second memory cell mapping step are performed at least in part with a 1 cell to 1 bit mapping.

24. The method of claim 20 further comprising:

selecting a second one of the memory cells; and determining a storage state of the second memory cell from a threshold voltage thereof, the determined storage state of the second memory cell being one of three possible storage states;

wherein the mapping step further comprises mapping the determined storage state of the second memory cell along with the determined storage state of the first memory cell at least in part with a 2 cell to 2 bit mapping.

25. The method of claim 20 further comprising:

selecting a second one of the memory cells;

determining a storage state of the second memory cell from a threshold voltage thereof, the determined storage state of the second memory cell being one of three possible storage states;

selecting a third one of the memory cells; and determining a storage state of the third memory cell from a threshold voltage thereof, the determined storage state of the third memory cell being one of three possible storage states;

wherein the mapping step further comprises mapping the determined storage state of the second and third memory cells along with the determined storage state of the first memory cell at least in part in a 3 cell to 4 bit mapping.

26. A method of programming a semiconductor memory comprising a plurality of three-level flash memory cells, the method comprising:

selecting a first plurality of the memory cells;

mapping a plurality of binary bits to respective storage states for the first plurality of memory cells, each of the storage states being one of three possible storage states; and programming the first plurality of memory cells with the storage states.

27. The method of claim 26 wherein the mapping step is performed at least in part with a 3 bit to 2 cell mapping.

28. The method of claim 26 wherein the mapping step is performed at least in part in a 3 to 2 mapping and a 1 bit to 1 cell mapping.

29. The method of claim 26 wherein the mapping step is performed at least in part in a 3 to 2 mapping and a 2 bit to 2 cell mapping.

30. The method of claim 26 wherein the mapping step is performed at least in part in a 4 bit to 3 cell mapping.

31. A method of operating a semiconductor memory comprising a plurality of three-level flash memory cells, the method comprising:

selecting a first plurality of the memory cells for programming;

mapping a multiple-bit binary value to respective storage states for the first plurality of memory cells, each of the storage states being one of three possible storage states;

programming the first plurality of memory cells to have threshold voltages corresponding to the storage states;

selecting a second plurality of the memory cells from the first plurality of memory cells for reading;

determining respective storage states of the selected second plurality of memory cell from the threshold voltage thereof; and mapping the determined storage states of the second plurality of memory cells to a multiple-bit binary value.

32. The method of claim 31 wherein:

the binary-value-to-storage-state mapping step is performed at least in part with a 3 bit to 2 cell mapping; and the storage-state-to-binary-value mapping step is performed at least in part with a 2 cell to 3 bit mapping.

33. The method of claim 31 wherein the binary-value-to-storage-state mapping step and the storage-state-to-binary-value mapping step are symmetrical mappings.

34. The method of claim 31 wherein the binary-value-to-storage-state mapping step and the storage-state-to-binary-value mapping step are asymmetrical mappings for reducing noise sensitivity.

35. The method of claim 32 wherein the 3 bit to 2 cell mapping and the 2 cell to 3 bit mapping are asymmetrical for reducing ground bus noise sensitivity, the 3 bit to 2 cell mapping comprising 000:00, 001:02, 010:10, 011:11, 100:12, 101:20, 110:21, and 111:22; and the 2 cell to 3 bit mapping comprising 00:000, 01:001, 02:001, 10:010, 11:011, 12:100, 20:101, 21:110, and 22:111.

36. A method of reading a semiconductor memory comprising a plurality of three-level flash memory cells, the method comprising:

selecting some of the memory cells, each of the selected memory cells having a threshold voltage corresponding to one of three possible storage states 0, 1 and 2;

for each of the selected memory cells, comparing the threshold voltage thereof against a first threshold reference voltage and a second threshold reference voltage, the first threshold reference voltage being set within a first voltage margin between the 2 state and the 1 state, and the second threshold reference voltage being set within a second voltage margin between the 1 state and the 0 state; and mapping the selected memory cells to a binary value from results of the comparing step.

37. The method of claim 36 wherein the second voltage margin is greater than the first voltage margin.

* * * * *